(12) United States Patent
Lederer et al.

(10) Patent No.: US 11,776,878 B2
(45) Date of Patent: Oct. 3, 2023

(54) POWER ELECTRONICS SYSTEM WITH A SWITCHING DEVICE AND A LIQUID COOLING DEVICE

(71) Applicant: SEMIKRON ELEKTRONIK GMBH & CO. KG, Nuremberg (DE)

(72) Inventors: Marco Lederer, Nuremberg (DE); Christian Zeiler, Pmmersfelden (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 165 days.

(21) Appl. No.: 17/542,217

(22) Filed: Dec. 3, 2021

(65) Prior Publication Data

US 2022/0181234 A1    Jun. 9, 2022

(30) Foreign Application Priority Data

Dec. 8, 2020  (DE) ..................... 10 2020 132 689.0

(51) Int. Cl.
*H01L 23/473*  (2006.01)
*H01L 23/433*  (2006.01)

(52) U.S. Cl.
CPC ........ *H01L 23/473* (2013.01); *H01L 23/4334* (2013.01)

(58) Field of Classification Search
CPC ..... H01L 23/043; H01L 23/053; H01L 23/10; H01L 23/12; H01L 23/121; H01L 23/296; H01L 23/3107; H01L 23/34; H01L 23/36; H01L 23/3672; H01L 23/3675; H01L 23/367; H01L 23/3735; H01L 23/40; H01L 23/4006; H01L 23/42; H01L 23/433;

(Continued)

(56) References Cited

U.S. PATENT DOCUMENTS 6,594,149 B2    7/2003  Yamada et al.
2007/0119568 A1  5/2007  Weber et al.
(Continued)

FOREIGN PATENT DOCUMENTS

DE    603 13430 T2    1/2008
DE    102010008553 A1  8/2011
(Continued)

OTHER PUBLICATIONS

DE 10 2020 132 689.0, German Search Report—1 page.
(Continued)

*Primary Examiner* — Amir A Jalali
(74) *Attorney, Agent, or Firm* — Andrew F. Young; NOLTE LACKENBACH SIEGEL

(57) ABSTRACT

A power electronics system has a switching device and a liquid cooling device. A switching device has a plate element, and power semiconductor devices are arranged on conductor tracks and connected by means of a connecting device, wherein the liquid cooling device has a first partial body having an inlet volume region and an outlet volume region and a second partial body. A cooling volume region is formed between the two partial bodies, wherein heat transfer bodies protrude into the cooling volume region from the second partial body. The second partial body is arranged in a recess of the first partial body and the two partial bodies are connected to each other and have a common plane surface which forms a first main surface.

14 Claims, 4 Drawing Sheets

(58) Field of Classification Search
CPC ............... H01L 23/473; H01L 23/4334; H01L 23/4735; H01L 23/492; H01L 23/49811; H01L 21/48; H01L 21/4878; H01L 24/72; H01L 25/07; H01L 25/072; H01L 25/0655; H01L 2924/13091; H01L 2924/13055; H05K 7/20; H05K 7/20309; H05K 7/20272; H05K 7/20509; H05K 7/20927; H05K 7/20254; H05K 7/20872; H05K 7/20854; H05K 7/209; H05K 1/0209; H05K 1/0213; H05K 1/11; H05K 1/18; H05K 1/181; B23K 3/085; B23K 37/003

See application file for complete search history.

(56) References Cited

U.S. PATENT DOCUMENTS

| | | | |
|---|---|---|---|
| 2009/0020266 A1 | 1/2009 | Weber et al. | |
| 2014/0043765 A1* | 2/2014 | Gohara | H05K 7/20254 361/699 |
| 2015/0091151 A1* | 4/2015 | Kulas | H01L 21/4878 438/122 |
| 2015/0097281 A1* | 4/2015 | Adachi | H01L 23/473 257/714 |
| 2015/0325494 A1* | 11/2015 | Kroneder | H01L 23/043 361/715 |
| 2016/0064303 A1* | 3/2016 | Ninomiya | H01L 23/473 165/80.4 |
| 2016/0242313 A1* | 8/2016 | Singh | H05K 1/184 |
| 2016/0343641 A1* | 11/2016 | Hori | H01L 25/072 |
| 2019/0363036 A1* | 11/2019 | Arai | H05K 7/20254 |
| 2020/0051892 A1* | 2/2020 | Gohara | H01L 23/043 |
| 2020/0266126 A1* | 8/2020 | Arai | H05K 7/209 |

FOREIGN PATENT DOCUMENTS

| | | |
|---|---|---|
| DE | 112014004043 T5 | 8/2016 |
| DE | 102019003030 A1 | 11/2019 |

OTHER PUBLICATIONS

DE 10 2020 132 689.0, Notice of Allowability, dated May 6, 2022, 6 pages German, 5 pages—English.

DE 10 2020 132 689..0, Amendment dated May 11, 2022, 3 pages—German, 3 pages—English.

DE 10 2020 132 689.0, German Search Report dated Oct. 6, 2021, 8 pages—English, 8 pages—German.

* cited by examiner

POWER ELECTRONICS SYSTEM WITH A SWITCHING DEVICE AND A LIQUID COOLING DEVICE

CROSS REFERENCE TO RELATED APPLICATIONS

This application relates to and claims priority to DE 10 2020 132 689.0 filed Dec. 8, 2020, the entire contents of which are incorporated herein fully by reference.

FIGURE SELECTED FOR PUBLICATION

FIG. 1

BACKGROUND OF THE INVENTION

Field of the Invention

The invention describes a power electronics system having a liquid cooling device and a switching device, the system preferably being designed as a power semiconductor module.

Description of the Related Art

A liquid-cooled switching device is known from the prior art, for example that disclosed in U.S. Pat. No. 6,594,149 B2. This has a switching module with a circuit element and a switching module base plate on which the circuit element is mounted, a switching housing for holding the switching module, and a coolant liquid chamber for directing a coolant liquid in contact with a rear side of a module base plate of the switching module.

A constant deficiency in such systems is the insufficient cooling capacity, wherein the typically thermal energy, which usually results from losses in the switching device, must be dissipated to a cooling medium in order to protect the switching device from overheating and thus destruction.

ASPECTS AND OBJECTS OF THE INVENTION

According to one alternative and adaptive aspect of the present invention there is provided a power electronics system having a switching device and a liquid cooling device is presented, wherein the switching device comprises a plate element, on the side of which, facing away from the liquid cooling device, power semiconductor devices are arranged on electrically insulated conductor tracks and connected in a circuit-compatible manner by means of a connecting device, wherein the liquid cooling device comprises a first partial body having an inlet volume region and an outlet volume region and a second partial body, wherein a cooling volume region is formed between the two partial bodies, wherein a multiplicity of heat transfer bodies protrudes into the cooling volume region from the second partial body, wherein the second partial body is arranged, preferably completely, in a recess of the first partial body and the two partial bodies are connected to each other in a materially-bonded and fluid pressure-tight manner and have a common plane surface which forms a first main surface, and wherein the liquid cooling device is designed and provided such that a coolant liquid flows through it from the inlet volume region via the cooling volume region to the outlet volume region and wherein the plate element of the switching device is arranged in a force-fitting manner on the first surface.

Having regard to these circumstances, one alternative object of the invention is to further develop the liquid cooling device of a power electronics system in such a way that the heat transfer from the switching device of the power electronics system to a cooling medium, more precisely to a cooling liquid, is improved.

This object is achieved according to the invention by a power electronics system having a switching device and a liquid cooling device, wherein the switching device comprises a plate element, on the side of which, facing away from the liquid cooling device, power semiconductor devices are arranged on electrically insulated conductor tracks and connected in a circuit-compatible manner by means of a connecting device, wherein the liquid cooling device comprises a first partial body having an inlet volume region and an outlet volume region and a second partial body, wherein a cooling volume region is formed between the two partial bodies, wherein a multiplicity of heat transfer bodies protrudes into the cooling volume region from the second partial body, wherein the second partial body is arranged, preferably completely, in a recess of the first partial body and the two partial bodies are connected to each other in a materially-bonded and fluid pressure-tight manner and have a common plane surface which forms a first main surface and wherein the liquid cooling device is designed and provided such that a coolant liquid flows through it from the inlet volume region via the cooling volume region to the outlet volume region and wherein the plate element of the switching device is arranged in a force-fitting manner on the first surface.

It can be advantageous if the plate element is formed as a base plate or a power electronics substrate. Both the base plate and the power electronics substrate or only the latter are ideally part of a power semiconductor module.

It may be preferable if the plate element is completely arranged only on the partial surface of the first surface which is formed by the second partial body, or if the plate element overlaps the partial surface of the second partial body, at least on one side, and also rests on the partial surface of the first partial body.

It may also be preferable if the heat transfer bodies have a round, oval, polyhedral or freely formed base surface and are pointed or tapered or not tapered, and preferably at least one heat transfer body, preferably a majority, and again preferably not all of the heat transfer bodies are in mechanical contact with a base surface of the cooling volume region.

It can be particularly advantageous if the first partial body consists of a first material and the second partial body consists of a second material. Both partial bodies can also be made of aluminium or an aluminium alloy. It is also preferred if a second thermal conductivity of the second material is at least 10%, preferably at least 25%, higher than a first thermal conductivity of the first material and if the second thermal conductivity is preferably at least 230 W/(mK).

It is preferable if the first partial body has a dome with a dome covering surface, which is arranged planar with the common surface, and if the dome extends through a recess of the second partial body and preferably comprises a blind hole with an internal thread.

It may also be advantageous if the first partial body comprises a multiplicity of identical recesses in which identical second partial bodies are arranged so that a multiplicity of cooling volume regions is thus formed, and wherein the inlet volume region and the outlet volume region each have a multiplicity of branches so that fluid can flow through the cooling volume regions in parallel. The second partial bodies can have a cuboidal shape and be arranged in a row adjacent to each other along their longitudinal sides. This allows the cooling medium to flow through the associated cooling volume regions in the longitudinal direction.

It can also be advantageous if the inlet volume region has a cross-sectional profile, wherein fluid flows through each of the individual branches of the inlet volume region with the same volume of fluid per unit time. It is particularly advantageous if the outlet volume region then has a correlated cross-sectional profile like the inlet volume region.

It may be preferable if the first partial body has further recesses extending out of a second main surface and in which further second partial bodies are arranged in a materially-bonded and fluid-pressure-tight manner, and wherein their surfaces form a further common plane surface with the second main side and their cooling volume region is also designed and provided such that fluid flows through it from the inlet volume region via the cooling volume region to the outlet volume region. The first and second main surfaces can be arranged parallel to each other and opposite each other.

It goes without saying that the various embodiments of the invention can be implemented either individually or in any combination, in order to achieve improvements. In particular, the above features and those mentioned here or below can be applied not only in the specified combinations, but also in other permissible combinations or in isolation, without departing from the scope of the present invention.

Further explanations of the invention, advantageous details and features are evident from the following description of the exemplary embodiments of the invention illustrated schematically in FIGS. 1 to 8, or from respective parts thereof.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
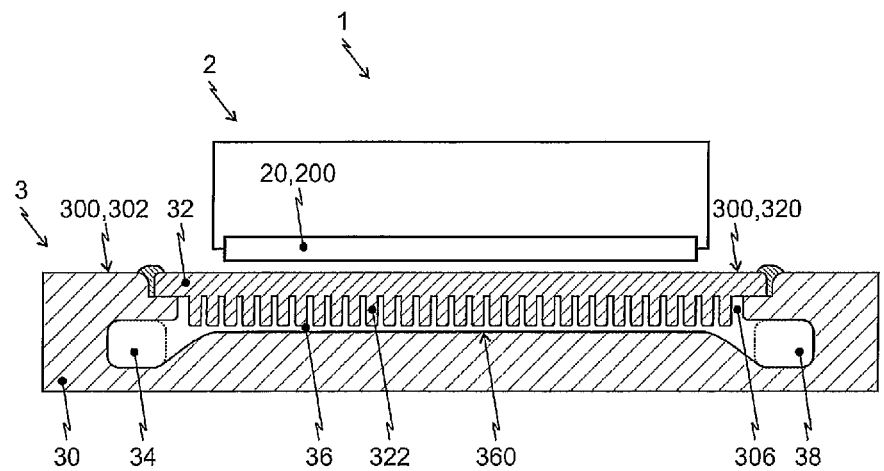
FIG. 1 shows a section through a first embodiment of a power electronics system according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a section through a first power electronics system 1 according to the invention. The illustration shows a liquid cooling device 3 which has a first and a second partial body 30,32. The first partial body 30 has an inlet volume region 34 and an outlet volume region 38, which each extend into the drawing plane and form a channel here. A cooling volume region 36 is formed between the inlet and the outlet volume regions 34,38.

To form this cooling volume region 36, the first partial body 30 has a recess 306 in which a second partial body 32 is arranged. This second partial body 32 has a plate-like basic shape and heat transfer bodies 322 which extend out of it and protrude into the cooling volume region 36. The plate-like basic shape forms a planar partial surface 320 on its side facing away from the cooling volume region 36. This planar partial surface 320 together with the surrounding planar partial surface 302 of the first partial body 30 forms a common planar first surface 300 of the liquid cooling device 3.

In this design, the plate-like basic shape of the second partial body 32 is located around the circumference of a support surface of the first partial body 30. Between an edge region of the second partial body 32 and a corresponding inner edge of the first partial body 30, a connecting medium 4 is arranged, here a brazing solder 40—see FIG. 2. As a result, the second partial body 32 is arranged in a materially-bonded and fluid-pressure-tight manner in the recess 306 and the cooling volume region 36 is designed in such a way that coolant liquid can flow through it from the inlet volume region 34 to the outlet volume region 38. The brazing solder 40 here protrudes beyond the first surface 300. However, it can also be recessed back compared to this and thus form a trench. It is particularly preferred if the brazing solder 40 protrudes according to the arrangement and in a further production step is ground to be planar with the first surface 300.

As an alternative to the brazing solder connection 40, the materially bonded connection between the first and second partial bodies 30,32 can also be formed as a welded joint. In the case of a preferred laser welding connection, no explicit connection means is arranged.

Both of these designs of the materially-bonded connection are particularly preferred if the first partial body 30 is made of aluminium or an aluminium alloy of a first thermal conductivity and the second partial body 32 is made of aluminium or an aluminium alloy of a second, higher thermal conductivity. Such a design has the substantial advantage that the material of the first partial body 30 can be optimized in terms of its mechanical stability, while the second partial body 32 can be optimized in terms of its heat transfer properties. The resulting hybrid liquid cooling device has substantial advantages in the sum of its physical properties compared to a conventional liquid cooling device made of only one material.

On the partial surface 320 of the second partial body 32, a power semiconductor module having a switching device 2 is arranged, which has a base plate 200 that forms the plate element 20. On this base plate 200, although not shown, a conventional power electronics substrate with power semiconductor components is arranged. Further necessary components of the power semiconductor module or the switching device, such as power connection elements, are also not shown here for reasons of clarity.

In particular, in particularly compact embodiments of the power electronics system 1, the plate element 20 protrudes laterally beyond the second partial body 32 or its partial surface 320 in at least one, preferably two opposite directions, or even all directions.

Figure 2:
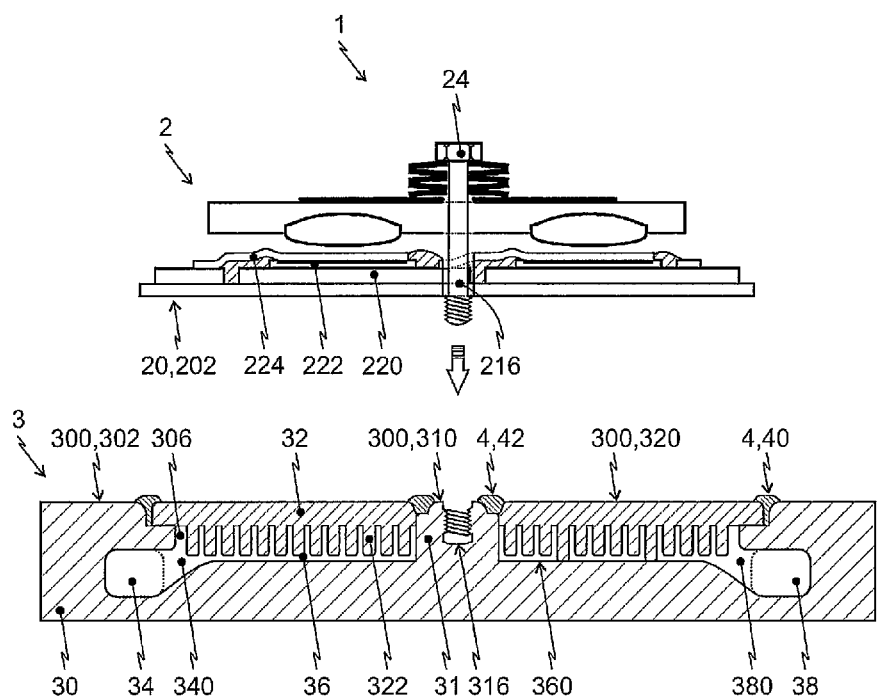
FIG. 2 shows a section through a second embodiment of a power electronics system according to the invention.

FIG. 2 shows a section through a second embodiment of a power electronics system 1 according to the invention. Here, the first partial body 30 again has an inlet and outlet volume region 34,38 and a partial surface 302. In addition, the first partial body 30, centrally located in the recess 306, has a dome 31 with a dome covering surface 310. This dome covering surface 310 is formed and arranged planar with the partial surface 302 of the first partial body 30 and also with the common surface 300. The dome 31 is cylindrical in shape and has a blind hole 316 with an internal thread.

Figure 3:
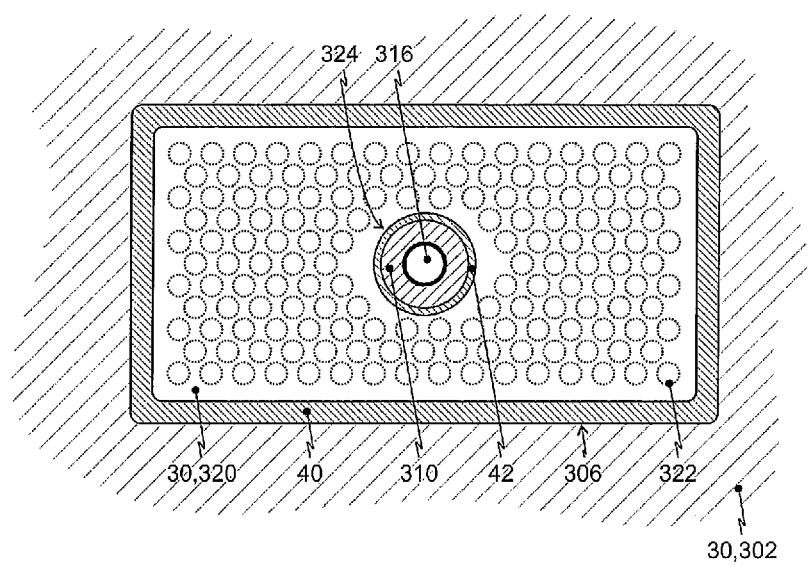
FIG. 3 shows a view of the liquid cooling device of this second embodiment.

In contrast to that according to the first embodiment, the second partial body 32 has a recess 324 corresponding to the dome 31, see FIG. 3, through which the dome extends 31. Of course, a materially bonded and fluid-pressure-tight connection 4 is also formed between the dome 31 and the second partial body 32, here again, purely as an example, by means of a brazing solder 42.

Also, in contrast to the first design, some of the heat transfer bodies 322 extend not only into the cooling volume region 36 but up to its base surface 360 where they form a bracing against the deflection of the second partial body 32.

The switching device 2 here is also conventionally designed, except that the plate element 20 is formed by the power electronics substrate 202 of the switching device 2. This also has a central recess 216 for a fastening device, in this case a screw connection device 24 corresponding to the recess of the dome. Also shown are conductor tracks 220, power semiconductor components 222, and an internal connecting device 224 of the switching device 2.

FIG. 3 shows a view of the liquid cooling device 3 of this second embodiment. The partial surface 302 of the first partial body 30 and its recess 306 for the arrangement of the second partial body 32 are shown. Also shown is the partial surface 320 of this second partial body 32, as well as its recess 324 for the dome 31 of the first partial body 30. The materially bonded connection of both partial bodies is formed as described above. Also shown are the position of the heat transfer bodies 322, each of which is formed in a cylindrical shape. Of course, these heat transfer bodies are arranged in the cooling volume region.

Figure 4:
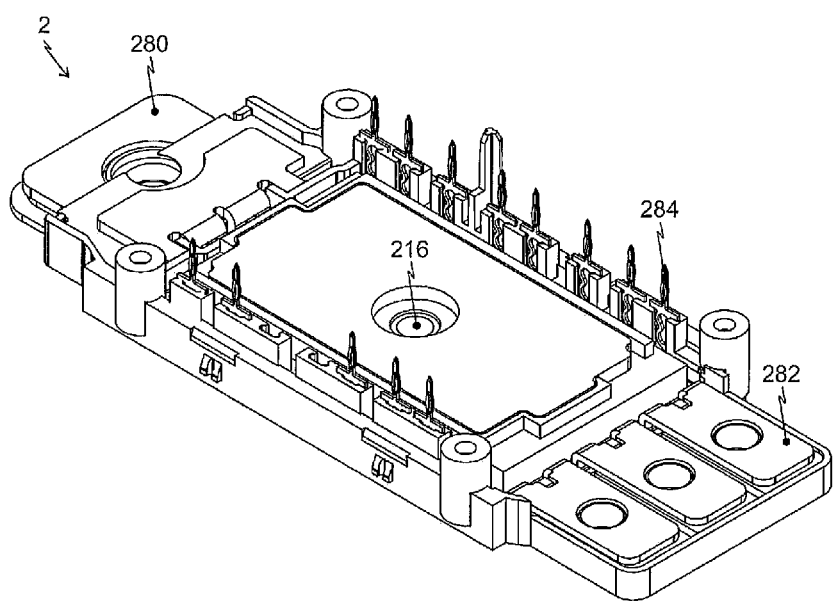
FIG. 4 shows a three-dimensional view of a power semiconductor module having a switching device of this second embodiment.

FIG. 4 shows a three-dimensional view of a power semiconductor module with a switching device 2 of this second embodiment. This power semiconductor module comprises the above described switching device 2 together with a power electronics substrate 202 with a central recess 216 for the arrangement of the screw connection device. Conventional electrical load and auxiliary contact devices 280,282,284 are also shown.

Figure 5:
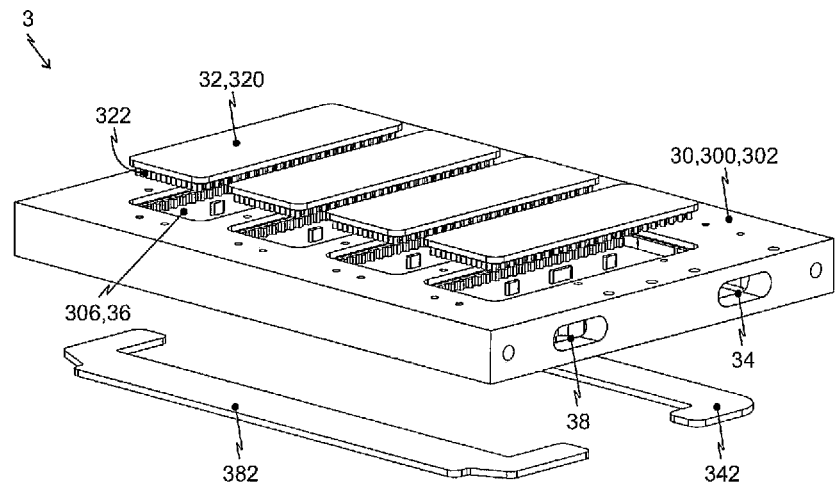
FIG. 5 shows a three-dimensional view of a first embodiment of a liquid cooling device of a power electronics system according to the invention.

FIG. 5 shows a three-dimensional view of a first embodiment of a liquid cooling device 3 of a power electronics system according to the invention. Shown is a first partial body 30 with four identical recesses 306, each for the arrangement of a second partial body 32. The first partial body 30 again has an inlet and outlet volume region 34,38, which are formed here as two parallel channels and are closed off on the surface opposite the first main surface by means of coverings 342,382. There are branches 340,380 that emanate from each of these channels, cf. also FIG. 2. The branches 340 of the inlet volume region 34 are designed to direct coolant liquid into the respective cooling volume regions 36.

The respective cross-section of the branches 340 is advantageously designed in such a way that the same volume of fluid flows through each of the individual cooling volume regions 36 per unit time. The branches 380 of the outlet volume region 38 are designed in a similar manner. Alternatively, or in addition, the cross-sectional profile can be designed in accordance with the inlet and outlet volume regions 34,38.

The second partial bodies 32 are essentially formed as described under FIG. 1, wherein they, or more precisely their plate-like basic shape, are cuboidal in shape. The recesses 306 of the first partial body 30 and thus the second partial bodies 32 are arranged in a row adjacent to one another along their longitudinal sides. As described, the first partial body 30 is designed in a matching way so that liquid flows through each of the cooling volume regions 36 assigned to the second partial bodies 32 in a longitudinal direction.

In terms of materials, the first and second partial bodies 30,32, as described above, are constructed from materials with different thermal expansion coefficients. This also applies to the following exemplary embodiments.

Figure 6:
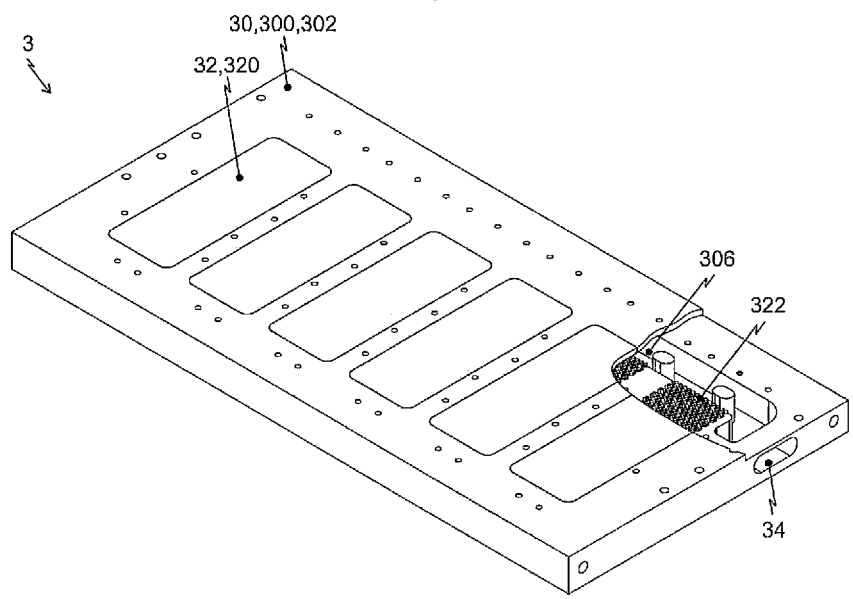
FIGS. 6 and 7 show a three-dimensional view of a second embodiment of a liquid cooling device of a power electronics system according to the invention.
Figure 7:
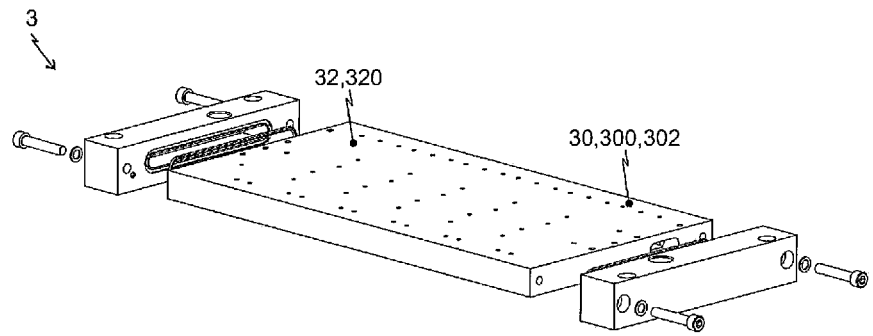

FIGS. 6 and 7 show a three-dimensional view of a second embodiment of a liquid cooling device 3 of a power electronics system according to the invention. The liquid cooling device 3 according to FIG. 6 shows a continuously plane surface 300, which forms the partial surfaces 302,320 of the first and the, here six, second partial bodies 30,32. FIG. 7 shows additional liquid connection elements for connecting to the liquid cooling device.

Figure 8:
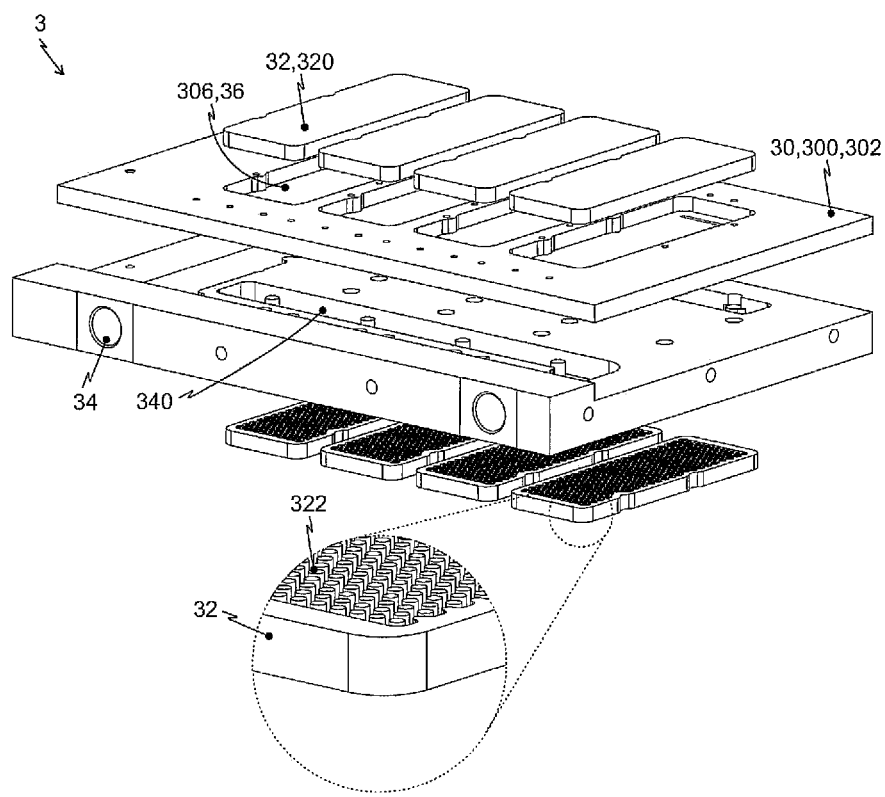
FIG. 8 shows a three-dimensional view of a third embodiment of a liquid cooling device of a power electronics system according to the invention.

FIG. 8 shows a three-dimensional view of a third embodiment of a liquid cooling device 3 of a power electronics system according to the invention. The first partial body 30, which here is itself made of multiple parts, shows further recesses 306, here extending out from its second main-surface, parallel to the first. In these, further second partial bodies 32 are arranged in a materially-bonded and fluid pressure-tight manner. This liquid cooling device 3 is therefore designed to allow switching devices to be arranged on both main sides. Power electronics systems of this kind then have a particularly high power density with smaller external dimensions.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronics system, having a switching device and a liquid cooling device, wherein:
   the switching device, further comprises:
      a plate element on the side of which, facing away from the liquid cooling device, a plurality of power semiconductor devices are arranged on electrically insulated conductor tracks and are connected in a circuit-compatible manner by means of a connecting device; and
   the liquid cooling device, further comprises:
      a first partial body having an inlet volume region and an outlet volume region and a second partial body, wherein a cooling volume region is formed between the two partial bodies, wherein a plurality of heat transfer bodies protrudes into the cooling volume region from the second partial body;
      the second partial body is arranged in a recess of the first partial body and the two partial bodies are connected to each other in a materially-bonded and fluid pressure-tight manner and have a common planar first surface that forms a first main surface;
      the liquid cooling device is designed and provided such that a coolant liquid flows through the liquid cooling device from the inlet volume region via the cooling volume region to the outlet volume region; and
   wherein the plate element of the switching device is arranged in a force-fitting manner on the common planar first surface.

2. The power electronics system, according to claim 1, wherein:
   the plate element is formed as one of a base plate and a power electronics substrate.

3. The power electronics system, according to claim 2, wherein:
   the plate element is completely arranged only on one of the partial surfaces of the common planar first surface formed by the second partial body and on wherein the plate element overlaps the partial surface of the second partial body at least on one side and also rests on the partial surface of the first partial body.

4. The power electronics system, according to claim 3, wherein:
   the heat transfer bodies have one of a round, oval, polyhedral and freely formed base surface and are one of pointed, tapered, and not tapered; and
   at least one heat transfer body is in mechanical contact with a base surface of the cooling volume region.

5. The power electronics system, according to claim 4, wherein:
   the first partial body consists of a first material and the second partial body consists of a second material which is different from the first material.

6. The power electronics system according to claim 5, wherein:
   both partial bodies consist of aluminum or an aluminum alloy.

7. The power electronics system, according to claim 5, wherein:
   a second thermal conductivity of the second material is at least 10% higher than a first thermal conductivity of the first material and the second thermal conductivity is at least 230 W/(mK).

8. The power electronics system, according to claim 5, wherein:
   the first partial body has a dome with a dome covering surface, which is arranged planar with the common planar first surface, and the dome extends through a recess of the second partial body and comprises a blind hole with an internal thread.

9. The power electronics system, according to claim 5, wherein:
   the first partial body further comprises:
      a multiplicity of identical recesses in which identical second partial bodies are arranged, a multiplicity of cooling volume regions being thus formed; and
   wherein the inlet volume region and the outlet volume region each have a multiplicity of branches so that fluid can flow through the cooling volume regions in parallel.

10. The power electronics system, according to claim 9, wherein:
    the second partial bodies are cuboidal in shape and are arranged adjacent to one another in a row along their longitudinal sides, such that fluid flows through the respective associated cooling volume regions in a longitudinal direction.

11. The power electronics system, according to claim 10, wherein:
    the inlet volume region has a cross-sectional profile; and
    wherein fluid flows through each of the individual branches of the inlet volume region with the same volume of fluid per unit time.

12. The power electronics system, according to claim 11, wherein:
    the outlet volume region has a correlated cross-sectional profile matching said inlet volume region cross-section profile.

13. The power electronics system, according to claim 2, wherein:
    the first partial body has recesses extending out from a second main surface, in which a plurality of further second partial bodies are arranged in a materially-bonded and fluid-pressure-tight manner and wherein their respective surfaces form a further common plane surface with the second main surface and their cooling volume region is also designed and provided such that fluid flows through the cooling volume region from the inlet volume region to the outlet volume region.

14. The power electronics system, according to claim 13, wherein:
    the first and second main surfaces are arranged parallel to and opposite each other.

* * * * *